US012660406B2

(12) United States Patent     (10) Patent No.:   US 12,660,406 B2

Stenzel et al.                      (45) Date of Patent:      Jun. 16, 2026

(54) METHOD FOR IMPROVING CONTACT RESISTANCE OF A MULTI-JUNCTION SOLAR CELL

(71) Applicants: HANWHA Q CELLS GMBH, Bitterfeld-Wolfen (DE); CE Cell Engineering GmbH, Kabelsketal (DE)

(72) Inventors: Florian Stenzel, Bitterfeld-Wolfen (DE); Ansgar Mette, Bitterfeld-Wolfen (DE); Stefan Hoernlein, Bitterfeld-Wolfen (DE); Martin Schaper, Bitterfeld-Wolfen (DE); Axel Schwabedissen, Bitterfeld-Wolfen (DE); Janko Cieslak, Bitterfeld-Wolfen (DE); Eckehard Hofmueller, Kabelsketal (DE); Stefan Stoeckel, Kabelsketal (DE); Eve Krassowski, Kabelsketal (DE)

(73) Assignees: Hanwha Q Cells GmbH, Bitterfeld-Wolfen (DE); CE Cell Engineering GmbH, Kabelsketal (DE)

( * ) Notice: Subject to any disclaimer, the term of this patent is extended or adjusted under 35 U.S.C. 154(b) by 102 days.

(21) Appl. No.: 18/581,168

(22) Filed: Feb. 19, 2024

(65) Prior Publication Data

US 2024/0284689 A1      Aug. 22, 2024

(30) Foreign Application Priority Data

Feb. 20, 2023    (DE) ..................... 10 2023 104 175.4

(51) Int. Cl.
    *H10K 39/12*      (2026.01)
    *H10K 39/15*      (2023.01)

(52) U.S. Cl.
    CPC ............. *H10K 39/12* (2023.02); *H10K 39/15* (2023.02)

(58) Field of Classification Search
    CPC ........ H10K 39/12; H10K 39/15; H10F 10/19; H10F 10/142; H10F 71/00; H10F 77/211; H10F 10/161; H10F 71/127; H02S 50/10
    See application file for complete search history.

(56) References Cited

U.S. PATENT DOCUMENTS 10,529,882 B2    1/2020   Uzu et al.
11,393,944 B2    7/2022   Hongming
               (Continued)

FOREIGN PATENT DOCUMENTS

DE    10 2016 009 560 A1    2/2018
DE    10 2018 001 057 A1    8/2019
               (Continued)

OTHER PUBLICATIONS

Blaga, Claire, et al., "Palliating the efficiency loss due to shunting in perovskite/silicon tandem solar cells through modifying the resistive properties of the recombination junction," *Sustainable Energy Fuels,* pp. 2036-2056 (2021).
               (Continued)

*Primary Examiner* — Michael Y Sun

(74) *Attorney, Agent, or Firm* — Christensen, Fonder, Dardi & Herbert PLLC; John P. Fonder

(57)            ABSTRACT

A method for improving contact resistance of a multi-junction solar cell having a front and a back and multiple subcells, including: a) delivering the solar cell with front and back contacts in grid, strip or transparent form; b) contact-connecting one region of the back contact to a contact device connected to one pole of a voltage source, and the front contact or another region of the back contact, which is electrically insulated from the region, to another contact device, which is connected to the other pole of the voltage source; c) applying a voltage against the forward direction of the solar cell to the contacts, the voltage smaller than a solar cell breakdown voltage; d) guiding a point light source over (Continued)

11 the solar cell, a subregion of the front or back being illuminated, inducing current in the subregion, and illuminating the subregion with light beams of different wavelengths.

10 Claims, 3 Drawing Sheets

(56) References Cited

U.S. PATENT DOCUMENTS

| 11,784,263 | B2 | 10/2023 | Zhao | |
| 2011/0116084 | A1* | 5/2011 | Lee | G01N 21/95684 |
| | | | | 356/237.1 |
| 2019/0044016 | A1* | 2/2019 | Uzu | H10F 77/20 |
| 2021/0083132 | A1* | 3/2021 | Finley | H10K 85/50 |
| 2023/0335668 | A1 | 10/2023 | Zhao et al. | |

FOREIGN PATENT DOCUMENTS

| DE | 10 2020 002 335 | A1 | 12/2021 |
| EP | 3 442 037 | A1 | 2/2019 |
| JP | 2001-168355 | A | 6/2001 |
| WO | WO 2017/175491 | A1 | 10/2017 |

OTHER PUBLICATIONS

Ghorai, Anaranya, et al., "Insights into the charge carrier dynamics in perovskite/Si tandem solar cells using transient photocurrent spectroscopy," *Applied Physics Letters*, vol. 120, 7 pages (2022).

Nesswetter, Halmut, et al., "Luminescence based series resistance mapping of III-V multijunction solar cells," *Journal of Applied Physics*, vol. 114, 7 pages (2013).

Orlando, Vincenzo, et al., "Temperature Accelerated Life Test and Failure Analysis on Upright Metamorphic $Fa_{0.37}In_{0.63}P/Ga_{0.83}In_{0.17}As/Ge$ Triple Junction Solar Cells," *Progress in Photovoltaics, Research and Applications*, vol. 28, Issue 2, pp. 148-166 (2019).

Scuto, Andrea, "Effect of illumination and electric field intensity on the efficiency improvement of amorphous silicon tandem solar cells," *J. Vac. Sci. Technol. B*, vol. 35, No. 1, 6 pages (2017).

Wang, Zhiping, et al., "High irradiance performance of metal halide perovskites for concentrator photovoltaics," *Nature Energy*, vol. 3, pp. 855-861 (2018).

* cited by examiner

METHOD FOR IMPROVING CONTACT RESISTANCE OF A MULTI-JUNCTION SOLAR CELL

PRIORITY CLAIM

The present application claims priority to German Patent Application No. 102023104175.4, filed on Feb. 20, 2023, which said application is incorporated by reference in its entirety herein.

FIELD OF THE INVENTION

The invention relates to a method for improving a contact resistance of a multi-junction solar cell. Multi-junction solar cells have at least two subcells, so-called p/n junctions, which are formed from different, layered materials. Each subcell has an absorber, each absorber usually being designed to absorb a different light-wavelength range than the other subcell(s). The light-facing upper subcell is generally designed to absorb light having a short wavelength and to allow longer-wavelength light to pass through, while the subcell arranged underneath is designed to absorb a portion of the light spectrum up to a cut-off wavelength, which in semiconductors is determined by a so-called band-gap energy. In principle, any number of subcells may be arranged on top of each other in order to increase the efficiency of the conversion of sunlight into electric current compared with a single-junction solar cell. The multi-junction solar cell therefore comprises an upper, light-facing upper subcell, a lower subcell and optionally one or more middle subcell(s) arranged between the upper and lower subcells.

BACKGROUND OF THE INVENTION

In the case of multi-junction solar cells, a distinction is drawn between mechanically stacked multi-junction solar cells, in which the subcells have been manufactured separately from each other and then interconnected in a hybrid design, and monolithic multi-junction solar cells, in which all subcells have been built on the same substrate. The multi-junction solar cell is moreover provided with at least one contact each for its front and its back.

Depending on the process control during the manufacture of the multi-junction solar cell, there may be periodically high contact resistances at the contacts. Such excessively high contact resistances lead to reduced efficiency for the multi-junction solar cell.

DE 10 2016 009 560 A1 and DE 10 2018 001057 A1 disclose methods for improving the resistive contact between the front contact grid and a doped layer in the form of an emitter layer. In this case, a single-junction solar cell in the form of a silicon wafer solar cell comprising the doped layer provided for the function as an emitter, a front contact grid and a back contact is initially delivered. The front contact grid is electrically contact-connected to a contact device that is electrically connected to one pole of a voltage source, and the back contact is electrically contact-connected to a contact device that is electrically connected to the other pole of the voltage source. The voltage source is used to apply a voltage directed against the forward direction of the silicon wafer solar cell, which voltage is smaller in magnitude than the breakdown voltage of the silicon wafer solar cell. When the voltage is applied, a point light source is routed over the sun-facing side of the silicon wafer solar cell. A section of a subregion of the sun-facing side is illuminated in the process and a flow of current is thus induced in the subregion locally. This flow of current related to the section has a current density of 200 A/cm$^2$ to 20 000 A/cm$^2$ and acts on the subregion for 10 ns to 10 ms. This method fails in the case of the multi-junction solar cell, however, as no flow of current occurs when a subcell is still in the reverse direction.

SUMMARY OF THE INVENTION

It is therefore an object of the invention to deliver methods for improving a contact resistance of a multi-junction solar cell. The aim is to increase the efficiency of the multi-junction solar cell.

The invention is accomplished by methods having the features of the claims. Advantageous modifications and developments are specified in the claims.

The invention relates to a method for improving a contact resistance of a multi-junction solar cell having a front and a back and multiple subcells, wherein the method comprises:
- a) delivering the multi-junction solar cell with a front contact and a back contact, the front contact and/or the back contact being in grid, strip or transparent form,
- b) electrically contact-connecting one region of the back contact to a contact device that is electrically connected to one pole of a voltage source, and the front contact or another region of the back contact, which is electrically insulated from the region, to another contact device, which is electrically connected to the other pole of the voltage source,
- c) applying a voltage directed against the forward direction of the multi-junction solar cell to the front contact and the back contact by means of the voltage source, the applied voltage being smaller in magnitude than the breakdown voltage of the multi-junction solar cell,
- d) guiding at least one point light source over the front and/or the back of the multi-junction solar cell while the voltage is applied, one or more sections of a subregion of the front or back being illuminated in the process, with the result that a flow of current is induced in the respective subregion and acts on the respective subregion, and the one or more sections of the subregion being illuminated with multiple light beams of different wavelengths by the point light source.

To achieve an improvement in contact resistance at the contacts, a very high current must flow locally through the contacts of the multi-junction solar cell. For this purpose, step c) comprises applying a reverse voltage to the multi-junction solar cell, and the multi-junction solar cell is illuminated locally in step d) while the voltage is applied, with the result that the current can flow. The light beams of different wavelengths allow adaptation for the respective absorption coefficients of the different absorbers of the subcells, with the result that the wavelengths are in each case in a suitable range for one of the absorbers of the multiple subcells. This ensures that, even when the illuminated solar cell surface of the multi-junction solar cell is at a depth >2-5 µm, a photoelectric effect can generate charge carriers that contribute to the flow of current. In the case of the multi-junction solar cell containing multiple subcells, the current flows only through one subcell, depending on the wavelength of the local illumination used. The other subcell(s) prevent the flow of current to the opposite contact because they are still in the reverse direction. The use of multiple light beams of different wavelengths to match each subcell allows the current to flow. A particular one of the different wavelengths of the multiple light beams is preferably adapted for a particular one of the subcells, more preferably for the bandgap of the absorber of the respective subcell, and can be applied extensively or locally at the same point as the illumination of the other subcell(s). The invention is based on the fundamental idea that all subcells are illuminated with a particular appropriately adapted wavelength so that the current can flow. The invention is based on the finding that if only one of the subcells is illuminated with a wavelength adapted for it, the other subcell(s) will block. Only through illumination with multiple light beams of different, appropriately adapted wavelengths do all subcells conduct current. In order to protect the upper subcell, the local current density can be adjusted using the size of the illuminated area. As a result, sufficient charge carriers can be generated in all subcells so that a flow of current is delivered by the entire multi-junction solar cell. Thus, the method according to the invention realizes an effectively controllable, local and subsequent improvement in the contact resistance.

The at least one point light source can be guided over the front or the back. Either the front contact and/or the back contact of the multi-junction solar cell are or is in grid, strip or transparent form in order to allow each of the light beams with different wavelengths given off by means of the at least one point light source to be absorbed by an absorber of one of the subcells. If the front and/or back contact are or is transparent, they are or it is preferably formed from TCO (transparent conductive oxides) such as ITO (indium-tin-oxide). The front and/or back contact may also be made of metal, e.g. silver or aluminium, however.

Preferably, the point light source is guided over the front and/or back of the multi-junction solar cell in step d), with the result that multiple subregions and multiple sections of the subregions are illuminated successively. Preferably, the at least one point light source is guided over the front and/or back in such a way that it scans the applicable side. As a result, the contact can be processed over the entire surface or essentially over the entire surface.

In a preferred embodiment, the multiple light beams of different wavelengths simultaneously illuminate a single section of the subregion, which the multiple light beams of different wavelengths illuminate in overlapping fashion. For example, a suitable optical system can be used so that all light beams simultaneously scan the surface of the lower or preferably upper subcell, with the result that the foci of all light beams are on top of each other or at least partially overlap.

Preferably, the at least one point light source is guided exclusively over either the front or the back of the multi-junction solar cell. This ensures that the multiple light beams overlap.

In a preferred embodiment, the at least one point light source has multiple flashlamps having multiple different spectral filters. As a result, only a single point light source is required in order to perform step d). This reduces the costs and space required for performing the method.

As an alternative preference, the at least one point light source has a laser device having multiple lasers designed to emit laser light of different wavelengths. Lasers deliver pinpoint illumination. The lasers may be diode lasers, Nd:YAG lasers or fiber lasers.

Alternatively, the at least one point light source has a laser device having a laser and a frequency doubler. Such a laser device is comparatively inexpensive. The laser may be a diode laser, an Nd:YAG laser or a fiber laser.

In a preferred embodiment, each subcell has an absorber and the wavelengths of the multiple light beams are each selected in such a way that they are each adapted for an absorption coefficient of the respective absorber. As a result, sufficient charge carriers are generated in step d) so that a sufficiently high current is generated for carrying out the method.

Preferably, one subcell of the multiple subcells is a perovskite subcell, i.e. it has perovskite as an absorber. A wavelength in the range from 500 to 650 nm, preferably e.g. 532 nm or 630 nm, is preferably used to illuminate the perovskite absorber. The thickness of the perovskite absorber is preferably in the range from 0.1 to 0.8 $\mu$m, more preferably 0.1 to 0.3 $\mu$m.

In a preferred embodiment, one subcell of the multiple subcells has a silicon-based absorber, i.e. this subcell is in the form of a silicon subcell. The lower subcell is e.g. a p-type PERC (Passivated Emitter and Rear Cell) subcell, heterojunction subcell, an n-type TOPCon (Tunnel Oxide Passivated Contact) subcell or an IBC (Interdigitated Back Contact) subcell. An IR wavelength, e.g. 1064 nm, is preferably used to illuminate the silicon subcell. The thickness of the silicon absorber is preferably in the range from 100-200 $\mu$m. At the wavelength of 1064 nm, the silicon subcell with the thickness of approximately 150±50 $\mu$m has a high transmission of >20%, but also a certain absorption in the depth of the solar cell surface >2-5 $\mu$m, with the result that sufficient charge carriers can be generated over the entire thickness of the silicon absorber or the silicon subcell to attain the required high current density in the method.

Preferably, the multi-junction solar cell has an upper perovskite subcell and a lower silicon subcell. Such a multi-junction solar cell is in principle less expensive to manufacture than e.g. an InGaP-based multi-junction solar cell and has relatively high efficiency. Preferably, the multi-junction solar cell delivered has an upper perovskite subcell and a lower silicon subcell, and a laser with an IR wavelength, e.g. around 1064 nm, which is required for illuminating the lower silicon subcell, is used, while a shorter wavelength of 532 nm or 630 nm is delivered for the upper perovskite subcell by means of the frequency doubler or the other laser. Light with a wavelength of 1064 nm will pass through said perovskite subcell due to high transmission. This means that if only one light beam of a wavelength, e.g. 1064 nm, is used there would be insufficient charge carriers locally generated in the perovskite subcell, which are required in order to generate the required high current density between the contacts. This can be guaranteed only by using the two different wavelengths of e.g. 1064 nm and 532 nm.

Preferably, the multi-junction solar cell is formed from an upper subcell and a lower subcell and is in the form of a 2T or 3T multi-junction solar cell, T standing for terminal, or connection. If the lower subcell is in the form of an IBC subcell, step b) preferably comprises electrically contact-connecting one region of the back contact to the contact device and another region of the back contact, which is electrically insulated from the region, to the other contact device, and step d) comprises guiding the at least one point light source over the front of the multi-junction solar cell. This means that regions of the front are not covered by the other contact device during step d), with the result that shading of the front by the other contact device is avoided while the at least one point light source is being guided over the front.

As an alternative preference, the multi-junction solar cell is formed from an upper subcell and a lower subcell and is in the form of a 4T multi-junction solar cell, T standing for terminal, or connection. Preferably, the upper subcell is in the form of a perovskite subcell. Preferably, the lower subcell is in the form of a silicon subcell, e.g. a p-type PERC subcell or an n-type TOPCon subcell.

In a preferred embodiment, the multi-junction solar cell has an upper subcell, a lower subcell and at least one middle subcell. Preferably, the multi-junction cell is a triple cell, which is a multi-junction solar cell having three subcells. Preferably, the multi-junction solar cell is illuminated in step d) with a number of wavelengths of the multiple light beams of different wavelengths that corresponds to a number of subcells, or absorbers thereof, each of the wavelengths preferably being adapted for a particular one of the absorbers, in particular for the absorption coefficient thereof.

For example, the multi-junction solar cell may be e.g. an InGaP/InGaAs/Ge triple cell. Such triple cells are distinguished by very high efficiency >30%. To carry out step d), three light beams with different wavelengths are used, e.g. 1064 nm, 830 nm and 488 nm, which are delivered e.g. by means of diode lasers or fiber lasers. The upper InGaP subcell is relatively transparent for the wavelength of 1064 nm and 830 nm, the middle InGaAs subcell is relatively transparent for the wavelength of 1064 nm, with the result that the laser with the wavelength of 488 nm can be used for charge carrier generation in the upper subcell, the laser with the wavelength of 830 nm can be used for charge carrier generation in the middle subcell and the laser with the wavelength 1064 nm can be used for charge carrier generation in the lower subcell. All three wavelengths are preferably radiated onto the surface of the upper subcell, with the result that the three foci are superimposed or at least partially overlap.

Preferably, the multi-junction solar cell is subjected to a power measurement, in particular an IV measurement, by means of a cell tester after step d).

BRIEF DESCRIPTION OF THE FIGURES

Further advantages and properties of the method are explained using preferred exemplary embodiments, which are described below. The figures are not drawn to scale, but rather are purely schematic and illustrative.

In the figures.

DETAILED DESCRIPTION

Figures 1, 2:
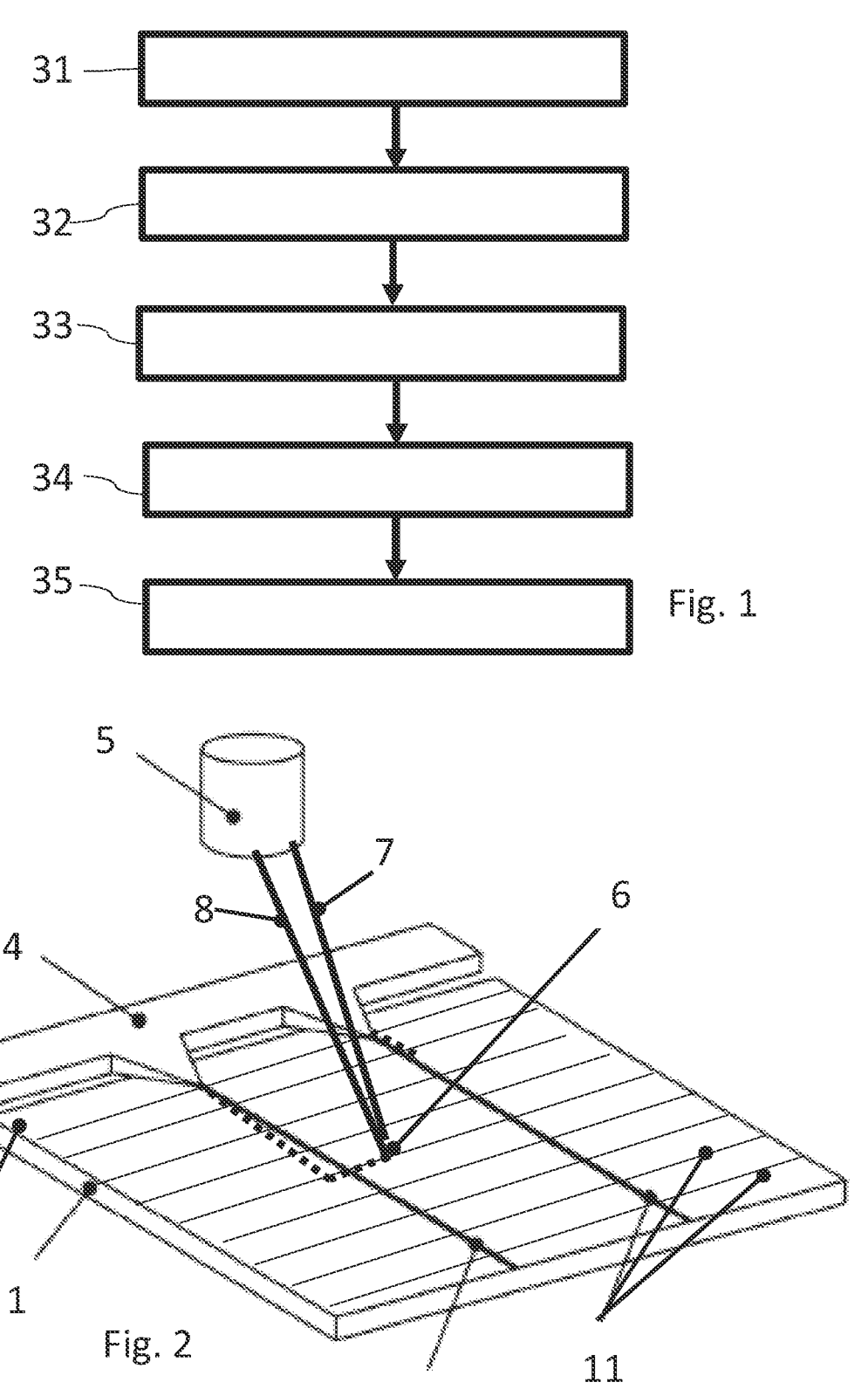
FIG. 1 shows a flowchart of a method according to the invention.
FIG. 2 shows a perspective view of a step of the method shown in FIG. 1.

FIG. 1 shows a flowchart of a method according to the invention. The method is used to improve a contact resistance of a multi-junction solar cell having a front and a back and multiple subcells. The method comprises a step 31 in which the multi-junction solar cell is delivered with a front contact and a back contact, the front contact and/or the back contact being in grid, strip or transparent form.

Step 31 is followed by a step 32, in which one region of the back contact is electrically contact-connected to a contact device that is electrically connected to one pole of a voltage source, and the front contact or another region of the back contact, which is electrically insulated from the region, is electrically contact-connected to another contact device, which is electrically connected to the other pole of the voltage source.

Subsequently, a step 33 is carried out in which a voltage directed against the forward direction of the multi-junction solar cell is applied to the front contact and the back contact by means of the voltage source, the applied voltage being smaller in magnitude than the breakdown voltage of the multi-junction solar cell.

Subsequently, a step 34 is carried out in which at least one point light source is guided over the front and/or the back of the multi-junction solar cell while the voltage is applied, one or more sections of a subregion of the front or back being illuminated in the process, with the result that a flow of current is induced in the respective subregion and acts on the respective subregion, and the one or more sections of the subregion being illuminated with multiple light beams of different wavelengths by the point light source.

Optionally, step 34 is followed by a step 35, in which the multi-junction solar cell is subjected to a power measurement, in particular, an IV measurement, by means of a cell tester.

FIG. 2 shows a perspective view of a step of the method shown in FIG. 1. FIG. 2 shows a multi-junction solar cell 1 having a front 100 and a back (not shown) and multiple subcells (not shown), which is subjected to step 34 shown in FIG. 1. The multi-junction solar cell 1 has a front contact 11 and a back contact (not shown), the front contact 11 being in grid form in the form of a multiplicity of contact fingers and two bus bars. The front contact 11 is electrically contact-connected to a contact device 4 that is electrically connected to one pole of a voltage source (not shown), and the back contact is electrically connected to another contact device (not shown), which is electrically connected to the other pole of the voltage source. A voltage directed against the forward direction of the multi-junction solar cell 1 is applied to the front contact 11 and the back contact by means of the voltage source, the applied voltage being smaller in magnitude than the breakdown voltage of the multi-junction solar cell 1. In step 34 shown in FIG. 1, a point light source 5 is guided over the front 100 of the multi-junction solar cell 1 while the voltage is applied. One or more sections 6 of a subregion of the front is or are illuminated in the process, with the result that a flow of current is induced in the respective subregion and acts on the respective subregion. The one or more sections 6 of the subregion are illuminated with multiple light beams 7, 8 of different wavelengths by the point light source 5. The foci of the light beams 7, 8 overlap at least for the most part.

Figure 3:
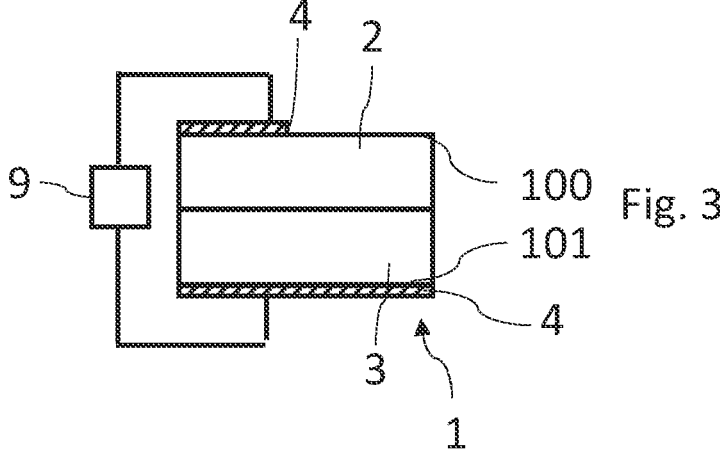
FIG. 3 shows a cross-sectional view of the step shown in FIG. 2.

FIG. 3 shows a cross-sectional view of the step shown in FIG. 2. The point light source shown in FIG. 2 and the front contact have been omitted for the sake of clarity. The front contact (not shown) is electrically contact-connected to the contact device 4 that is electrically connected to one pole of the voltage source 9, and the back contact (not shown) is electrically connected to the other contact device 4, which is electrically connected to the other pole of the voltage source 9. The multi-junction solar cell 1 is in the form of a tandem solar cell and has an upper subcell 2 and a lower subcell 3, the upper subcell 2 forming the front 100 and the lower subcell forming the back 101 of the multi-junction solar cell 1.

Figure 4:
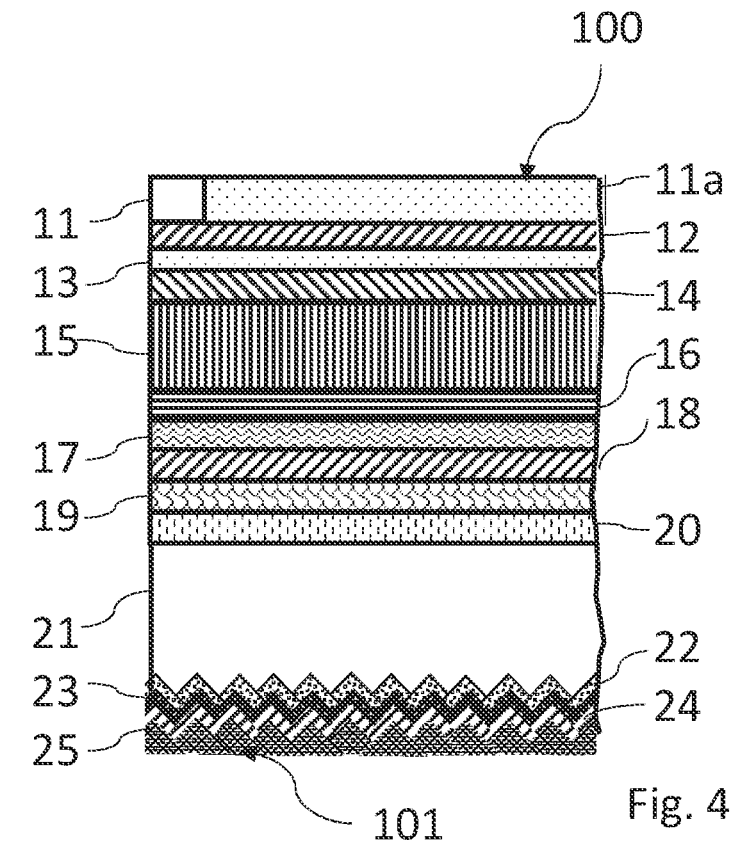
FIG. 4 shows a detailed partial cross-sectional view of the multi-junction solar cell shown in FIGS. 1 and 2.

FIG. 4 shows a detailed partial cross-sectional view of the multi-junction solar cell shown in FIGS. 1 and 2. The multi-junction solar cell 1 is formed from the upper subcell 2 with an absorber 15 and the lower subcell 3 with another absorber 21. The lower subcell 3 is in the form of a heterojunction subcell purely by way of illustration. The lower subcell may also be in the form of a PERC or TOPC on subcell, which is not shown here. The multiple subcell 1 has the following structure in the specified sequence:

a front contact 11, e.g. made of Ag, and an MgF$_2$ layer 11*a*, an electrically conductive layer 12 such as an ITO layer, a buffer and electron conductor layer 13 such as an SnO$_2$ layer, a passivating and hole blocking layer 14 such as an LiF/C60 layer, an absorber 15 having a layer thickness of approximately 500 nm, a PFN layer 16, a PTAA layer 17, an electrically conductive layer 18 such as an ITO layer, an n-type amorphous Si layer 19, an intrinsic amorphous Si layer 20, another absorber 21 such as a silicon substrate in the form of a p-type or n-type CZ-Si substrate, an intrinsic amorphous silicon layer 22, a p-type amorphous silicon layer 23, an electrically conductive layer 24 such as an ITO layer, and a back contact 25, e.g. made of Ag.

Figures 5, 6:
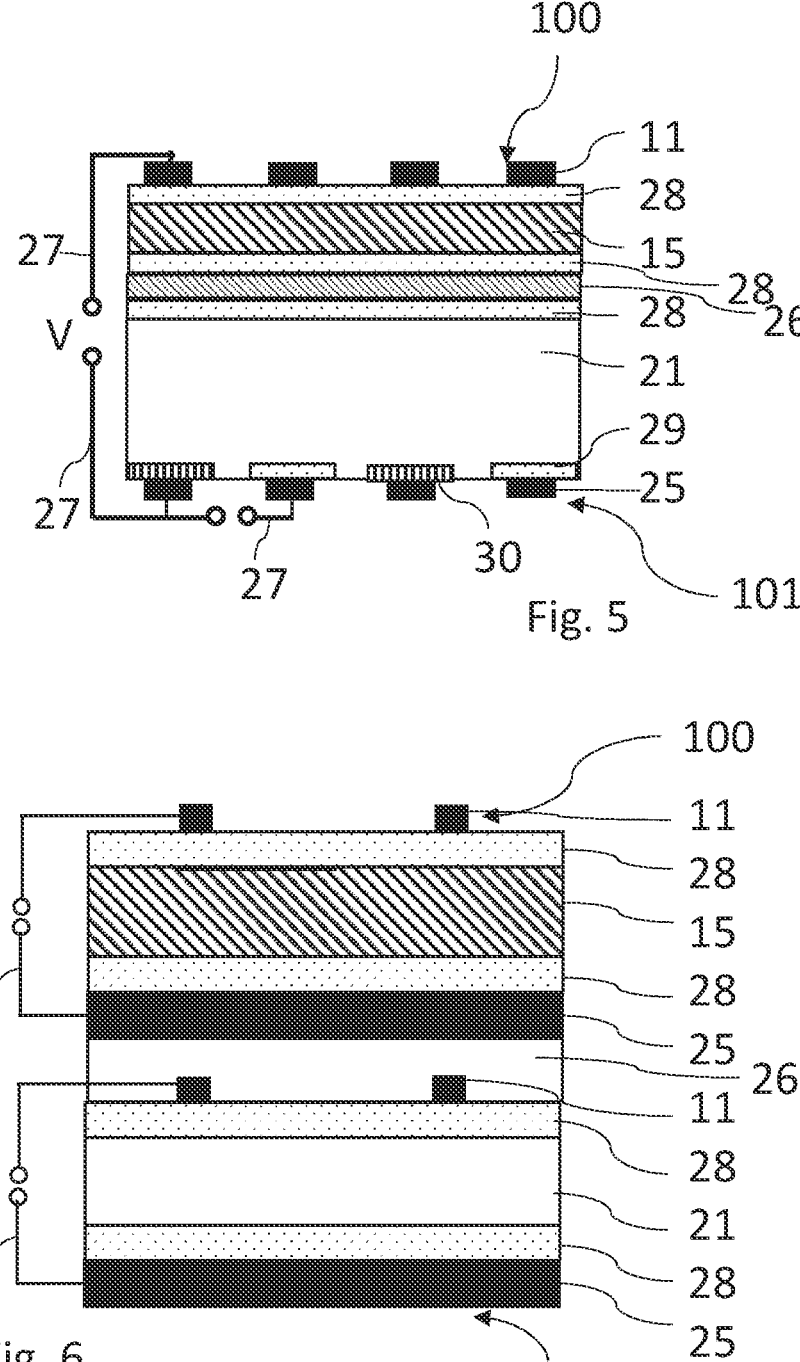
FIG. 5 shows a cross-sectional view of another multi-junction solar cell delivered in the method shown in FIG. 1.
FIG. 6 shows a cross-sectional view of yet another multi-junction solar cell delivered in the method shown in FIG. 1.

FIG. 5 shows a cross-sectional view of another multi-junction solar cell delivered in the method shown in FIG. 1, which can be subjected to the method as an alternative to the multi-junction solar cell shown in FIG. 4. As an alternative to the solar cell shown in FIG. 4, the multi-junction solar cell 1 shown in FIGS. 1 to 3 may also be a 3T tandem solar cell. This multi-junction solar cell 1 has an upper subcell with an absorber 15 and a lower subcell with another absorber 21. The lower subcell is in the form of an IBC cell.

The tandem solar cell shown in FIG. 5 has a front 100 and a back 101 and the following layer structure:

a front contact 11, a reflective layer 28, an absorber 15, e.g. perovskite absorber, a reflective layer 28, an intermediate layer 26, a reflective layer 28, another absorber 21, e.g. silicon absorber, p-type emitter ranges 29 and n-type emitter ranges 30, and a back contact 25, which is arranged in strip form on the p-type emitter regions 29 and n-type emitter regions 30.

This tandem solar cell is in the form of a 3-terminal solar cell, because it has three electrical connections 27.

FIG. 6 shows a cross-sectional view of yet another multi-junction solar cell delivered in the method shown in FIG. 1, which can be subjected to the method as an alternative to the multi-junction solar cell shown in FIGS. 4 and 5. It is a 4T tandem solar cell. This multi-junction solar cell 1 is composed of an upper subcell with an absorber 15 and a lower subcell with another, silicon-based absorber 21. It has the following layer structure:

a front contact 11 of the upper subcell, a reflective layer 28, an absorber 15, e.g. perovskite absorber, a reflective layer 28, a back contact 25 of the upper subcell, an intermediate layer 26, a front contact 11 of the lower subcell, a reflective layer 28, another absorber 21, e.g. silicon absorber, a reflective layer 28, and a back contact 25 of the lower subcell.

Each of the upper and lower subcells has a front contact 11 and a back contact 25 in each case, which are electrically connected by in each case two of the total of four electrical connections 27.

LIST OF REFERENCE SIGNS

1 multi-junction solar cell
2 subcell
3 subcell
4 contact device
5 light source
6 section
7 light beam
8 further light beam
9 voltage source
10 subcell
11 front contact
11*a* MgF$_2$ layer
12 electrically conductive layer
13 electron conductor layer
14 hole blocking layer
15 perovskite absorber
16 PFN layer
17 PTAA layer
18 electrically conductive layer
19 n-type amorphous silicon layer
20 intrinsic amorphous silicon layer
21 silicon absorber
22 intrinsic amorphous silicon layer
23 p-type amorphous silicon layer
24 electrically conductive layer
25 back contact
26 intermediate layer
27 terminal connection
28 reflective layer
29 p-emitter region
30 n-emitter region
31 deliver
32 contact-connect
33 apply
34 guide
35 test
100 front
101 back

The invention claimed is:

1. A method for improving a contact resistance of a multi-junction solar cell having a front and a back and multiple subcells, the method comprising:

a) delivering the multi-junction solar cell with a front contact and a back contact, the front contact and/or the back contact being in grid, strip or transparent form, b) electrically contact-connecting one region of the back contact to a contact device that is electrically connected to one pole of a voltage source, and the front contact or another region of the back contact, which is electrically insulated from the region, to another contact device, which is electrically connected to another pole of the voltage source, c) applying a voltage directed against a forward direction of the multi-junction solar cell to the front contact and the back contact using the voltage source, the applied voltage being smaller in magnitude than a breakdown voltage of the multi-junction solar cell, d) guiding at least one point light source over the front and/or the back of the multi-junction solar cell while the voltage is applied, one or more sections of a subregion of the front or back being illuminated, with a result that a flow of current is induced in a respective subregion and acts on the respective subregion, and the one or more sections of the subregion being simultaneously illuminated with multiple light beams having different wavelength ranges by the point light source.

2. The method according to claim 1, wherein the multiple light beams having different wavelength ranges simultaneously illuminate a single section of the subregion, which the multiple light beams having different wavelength ranges illuminate in at least a partially-overlapping fashion.

3. The method according to claim 1, wherein the at least one point light source is guided exclusively over either the front or the back of the multi-junction solar cell.

4. The method according to claim 1, wherein the at least one point light source has multiple flashlamps having multiple different spectral filters, the at least one point light source has a laser device having multiple lasers designed to emit laser light of different wavelengths, or the at least one point light source has a laser device having a laser and a frequency doubler.

5. The method according to claim 1, wherein each subcell has an absorber and the wavelength ranges of the multiple light beams are respectively selected in such a way that the wavelength ranges are each adapted for an absorption coefficient of a respective absorber.

6. The method according to claim 1, wherein one subcell of the multiple subcells is a perovskite subcell.

7. The method according to one of claim 1, wherein one subcell of the multiple subcells has a silicon-based absorber.

8. The method according to claim 1, wherein the multi-junction solar cell is formed from an upper subcell and a lower subcell and is in a form of a 2T, 3T or 4T multi-junction solar cell.

9. The method according to claim 1, wherein the multi-junction solar cell has an upper subcell, a lower subcell and at least one middle subcell.

10. The method according to claim 1, wherein a number of wavelength ranges of the multiple light beams of different wavelength ranges in step d) corresponds to a number of subcells, or absorbers thereof, each of the wavelength ranges being adapted for a particular absorption coefficient of the absorbers.

\* \* \* \* \*